United States Patent
Teff et al.

(10) Patent No.: US 7,531,590 B2
(45) Date of Patent: *May 12, 2009

(54) ADDITIVES TO PREVENT DEGRADATION OF ALKYL-HYDROGEN SILOXANES

(75) Inventors: Daniel J. Teff, Chandler, AZ (US); Gregory B. Smith, Gilbert, AZ (US); John L. Chagolla, Mesa, AZ (US); Tim S. Andreyka, Gold Canyon, AZ (US)

(73) Assignee: Fujifilm Electronic Materials U.S.A., Inc., North Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/496,135

(22) Filed: Jul. 31, 2006

(65) Prior Publication Data

US 2006/0270787 A1 Nov. 30, 2006

Related U.S. Application Data

(63) Continuation of application No. 10/665,739, filed on Sep. 18, 2003, now Pat. No. 7,129,311.

(60) Provisional application No. 60/411,651, filed on Sep. 18, 2002.

(51) Int. Cl.
*C08K 5/05* (2006.01)
(52) U.S. Cl. .............. 524/340; 524/339; 524/588; 528/31; 252/183.12; 106/287.14
(58) Field of Classification Search ............ 252/183.12; 528/31; 524/588, 339, 340; 106/287.14
See application file for complete search history.

(56) References Cited

U.S. PATENT DOCUMENTS

| | | | |
|---|---|---|---|
| 4,234,441 A | | 11/1980 | Scott et al. |
| 5,118,735 A | | 6/1992 | Burnier |
| 5,177,142 A | | 1/1993 | Stein et al. |
| 5,241,034 A | * | 8/1993 | Herzig et al. ............. 528/15 |
| 5,556,901 A | * | 9/1996 | Bryson .................... 524/99 |
| 6,369,186 B1 | * | 4/2002 | Branlard et al. ............ 528/26 |
| 6,858,697 B2 | * | 2/2005 | Mayorga et al. ............ 528/31 |
| 7,101,948 B2 | | 9/2006 | Mayorga et al. |
| 7,108,771 B2 | | 9/2006 | Xu et al. |

FOREIGN PATENT DOCUMENTS

| | | |
|---|---|---|
| EP | 1321469 A1 | 6/2003 |
| JP | 07145179 A | 6/1995 |

* cited by examiner

*Primary Examiner*—Margaret G Moore
(74) *Attorney, Agent, or Firm*—Fish & Richardson P.C.

(57) ABSTRACT

An organohydrosiloxane composition comprising:
  a) one or more organohydrosiloxane compounds, each having at least one [—HSiR—O—] unit, wherein R=$C_1$-$C_{18}$ linear, branched, or cyclic alkyl, $C_1$-$C_{18}$ linear, branched, or cyclic alkoxy, or substituted or unsubstituted aryl, and
  b) an antioxidant compound shown in Formula (1)

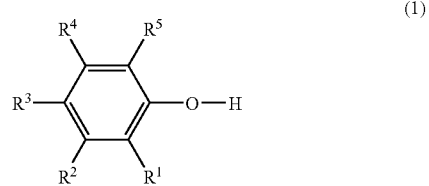

(1)

wherein the antioxidant compound is a phenolic compound and is present in a concentration from about 1 ppm to about 5,000 ppm and wherein $R^1$ through $R^5$ can each independently be H, OH, $C_1$-$C_{18}$ linear, branched, or cyclic alkyl, $C_1$-$C_{18}$ linear, branched, or cyclic alkoxy or substituted or unsubstituted aryl. The compositions of present invention exhibit stability and significantly extend the shelf life of organohydrosiloxane products and allow greater flexibility in handling these products in chemical processes or semiconductor manufacturing. The resulting stabilization of siloxanes prevents the possibility of complete polymerization (i.e., solidification) of product in chemical delivery lines or valves, which lowers equipment maintenance and costs and reduces time the machinery is out of production.

23 Claims, 1 Drawing Sheet

ADDITIVES TO PREVENT DEGRADATION OF ALKYL-HYDROGEN SILOXANES

CROSS-REFERENCE TO RELATED APPLICATIONS

This Application is a continuation of U.S. application Ser. No. 10/665,739, filed Sep. 18, 2003, now U.S. Pat. No. 7,129,311, which claims priority from U.S. Provisional Patent Application No. 60/411,651, filed on Sep. 18, 2002.

BACKGROUND OF THE INVENTION

1. Field of the Invention

The present invention relates generally to siloxane compositions that exhibit stability to moisture and oxygen. More particularly, the present invention is directed to organohydrosiloxanes stabilized with one or more antioxidant compounds.

2. Description of the Prior Art 1,3,5,7-Tetramethylcyclotetrasiloxane (TMCTS) is one example of an organohydrosiloxane (i.e., constructed of [—HSiR—O—] units where R is alkyl, and in this case, methyl) that can be used for specialty polymer formation. TMCTS is an example of a cyclic organohydrosiloxane, and it has the ability to undergo ring opening polymerization. It also has reactive Si—H bonds that can be used for adding functionality to the resulting polymer. Due to these unique properties, the semiconductor industry recently chose TMCTS as a new precursor for the plasma enhanced chemical vapor deposition (PECVD) of Low K dielectric films on semiconductor wafers by chemical vapor deposition.

The introduction of TMCTS and similar cyclic organohydrosiloxanes into the semiconductor fab has been causing serious manufacturing challenges because these materials can polymerize unpredictably. This behavior can be very costly and time consuming if polymerization occurs inside liquid or vapor chemical delivery lines where the only remedy is to disassemble and replace the affected lines. The semiconductor industry demands a stable, predictable and reliable product, and this behavior is unacceptable for high volume semiconductor manufacturing. Therefore, it is necessary to find a means to stabilize TMCTS to ensure that the product does not polymerize during transport from the chemical supplier to the end-use process, even after exposure to various conditions.

TMCTS and other alkyl-hydrogen linear or cyclic siloxanes having Si—H bonds can react with oxygen or other components of air. This reaction can cause significant degradation of the siloxane, and when cyclic materials are involved, complete polymerization can eventually result, even after brief air exposure at room temperature.

Degradation of the chemical reduces shelf life, lowers product quality, and can even cause greater problems such as equipment downtime if the material polymerizes in chemical processing equipment. Safety issues are also a concern if pressurized chemical lines and valves become blocked.

For the semiconductor industry, degradation of an organohydrosiloxane product to higher molecular weight species causes additional problems with chemical use. The most common method to introduce high boiling point (e.g., >50° C.) materials into a processing tool is by directly injecting a vapor or mist of chemical into a heated "carrier" gas stream that flows into a process chamber below ambient pressure. The heated stream of carrier gas vaporizes the product, and the product vapor is transported to the process chamber where the siloxane is transformed into a carbon doped silicon oxide film. However, this technique usually involves a single, pure species in order to have homogeneous product vapor inside the equipment. If high molecular weight species are present, as found in degraded organohydrosiloxanes, they do not readily vaporize in the heated gas stream, but instead simply collect on the internal surfaces of the process equipment. This leads to several problems, including, for example, clogged transfer lines and valves and particle formation on a wafer.

There have been prior art attempts to stabilize siloxane and silane-containing compositions. U.S. Pat. No. 5,177,142 to Stein et al. discloses silicone release coating compositions comprising a polydiorganosiloxane containing unsaturated group, a crosslinking agent containing Si—H groups, and a hydrosilation catalyst. The catalyst is inhibited by incorporating at least one free radical inhibitor, such as alkoxyphenols, in the composition. As a result, the compositions have a reduced tendency to bond to acrylic adhesives.

U.S. Pat. No. 5,556,901 to Bryson discloses a polysilane-based composition used particularly for producing silicon carbide. The composition comprises polysilane chains capable of being degraded by oxidation and the formation of polysiloxane-type products, and at least one antioxidant system. The antioxidant system greatly reduces the sensitivity to air of the polysilanes.

What is lacking in the prior art is a composition, like the present invention, comprising organohydrosiloxanes that exhibits improved stability to moisture and oxygen, for use in the semiconductor field. The stable composition of the present invention significantly extends the shelf life of organohydrosiloxane products and provides greater flexibility in handling these products in chemical processes or semiconductor manufacturing. The resulting stabilization of siloxanes prevents the possibility of complete polymerization (i.e., solidification) of product in chemical delivery lines or valves, which lowers equipment maintenance and costs and reduces time the machinery is out of production. In addition, reducing the formation of higher molecular weight compounds allows homogeneous vaporization of the product without concern for the gradual deposition of higher molecular weight compounds in vapor delivery lines leading to more consistent, higher quality deposited films.

SUMMARY OF THE INVENTION

The invention provides an organohydrosiloxane composition comprising:

a. one or more organohydrosiloxane compounds, each having at least one [—HSiR—O—] unit, wherein R=$C_1$-$C_{18}$ linear, branched, or cyclic alkyl, $C_1$-$C_{18}$ linear, branched, or cyclic alkoxy, or substituted or unsubstituted aryl; and b. an antioxidant compound of Formula (1),

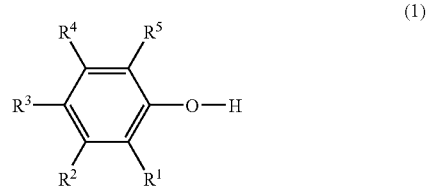

(1)

wherein the antioxidant compound is a phenolic compound and is present in an amount between about 1 ppm to about 5000 ppm, and wherein $R^1$ through $R^5$ are each independently H, OH, $C_1$-$C_{18}$ linear, branched, or cyclic alkyl, $C_1$-$C_8$ linear, branched, or cyclic alkoxy or substituted or unsubstituted aryl.

The invention also provides an organohydrosiloxane composition comprising:

a. one or more organohydrosiloxane compounds, each having at least one [—HSiR—O—] unit, wherein R=$C_1$-$C_{18}$ linear, branched, or cyclic alkyl, $C_1$-$C_{18}$ linear, branched, or cyclic alkoxy, or substituted or unsubstituted aryl;

b. an antioxidant compound of Formula (1),

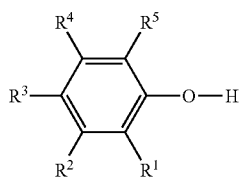

(1)

wherein the antioxidant compound is a phenolic compound and is present in an amount between about 1 ppm to about 5000 ppm, and wherein $R^1$ through $R^5$ are each independently H, OH, $C_1$-$C_{18}$ linear, branched, or cyclic alkyl, $C_1$-$C_{18}$ linear, branched, or cyclic alkoxy or substituted or unsubstituted aryl; and c. an alkoxysilane of Formula (2),

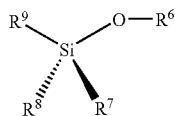

(2)

wherein the alkoxysilane is present in an amount between about 1 ppm and about 5000 ppm; and wherein $R^6$ is a $C_1$-$C_{18}$ linear, branched, or cyclic alkyl or substituted or unsubstituted aryl; and $R^7$, $R^8$, and $R^9$ are independently H, $C_1$-$C_{18}$ linear, branched, or cyclic alkyl, $C_1$-$C_{18}$ linear, branched, or cyclic alkoxy or substituted or unsubstituted aryl.

In addition to the above compositions, the present invention also provides a process for forming an oxide layer on a substrate comprising the steps of:

a. introducing an organohydrosiloxane composition into a gas stream, thereby forming a process vapor;

b. contacting a surface of the substrate with the process vapor; and c. decomposing the process vapor, thereby forming the oxide layer on the substrate, wherein the organohydrosiloxane composition comprises:

a. one or more organohydrosiloxane compounds, each having at least one [—HSiR—O—] unit, wherein R=$C_1$-$C_{18}$ linear, branched, or cyclic alkyl, $C_1$-$C_{18}$ linear, branched, or cyclic alkoxy, or substituted or unsubstituted aryl; and b. an antioxidant compound of Formula (1),

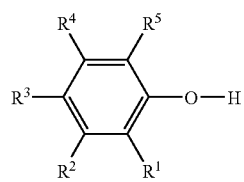

(1)

wherein the antioxidant compound is a phenolic compound and is present in an amount between about 1 ppm to about 5000 ppm, and wherein $R^1$ through $R^5$ are each independently H, OH, $C_1$-$C_{18}$ linear, branched, or cyclic alkyl, $C_1$-$C_{18}$ linear, branched, or cyclic alkoxy or substituted or unsubstituted aryl.

Another process for forming an oxide layer on a substrate according to the present invention comprises the steps of:

a. introducing an organohydrosiloxane composition into a gas stream, thereby forming a process vapor;

b. contacting a surface of the substrate with the process vapor; and c. decomposing the process vapor, thereby forming the oxide layer on the substrate, wherein the organohydrosiloxane composition comprises:

a. one or more organohydrosiloxane compounds, each having at least one [—HSiR—O—] unit, wherein R=$C_1$-$C_{18}$ linear, branched, or cyclic alkyl, $C_1$-$C_{18}$ linear, branched, or cyclic alkoxy, or substituted or unsubstituted aryl;

b. an antioxidant compound of Formula (1),

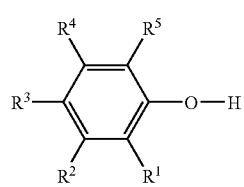

(1)

wherein the antioxidant compound is a phenolic compound and is present in an amount between about 1 ppm to about 5000 ppm, and wherein $R^1$ through $R^5$ are each independently H, OH, $C_1$-$C_{18}$ linear, branched, or cyclic alkyl, $C_1$-$C_{18}$ linear, branched, or cyclic alkoxy or substituted or unsubstituted aryl; and c. an alkoxysilane of Formula (2),

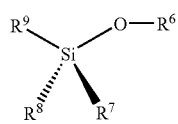

(2)

wherein the alkoxysilane is present in an amount between about 1 ppm to about 5000 ppm; and wherein $R^6$ is a $C_1$-$C_{18}$ linear, branched, or cyclic alkyl or substituted or unsubstituted aryl; and $R^7$, $R^8$, and $R^9$ are independently H, $C_1$-$C_{18}$ linear, branched, or cyclic alkyl, $C_1$-$C_{18}$ linear, branched, or cyclic alkoxy or substituted or unsubstituted aryl.

DETAILED DESCRIPTION OF THE INVENTION

Figure 1:
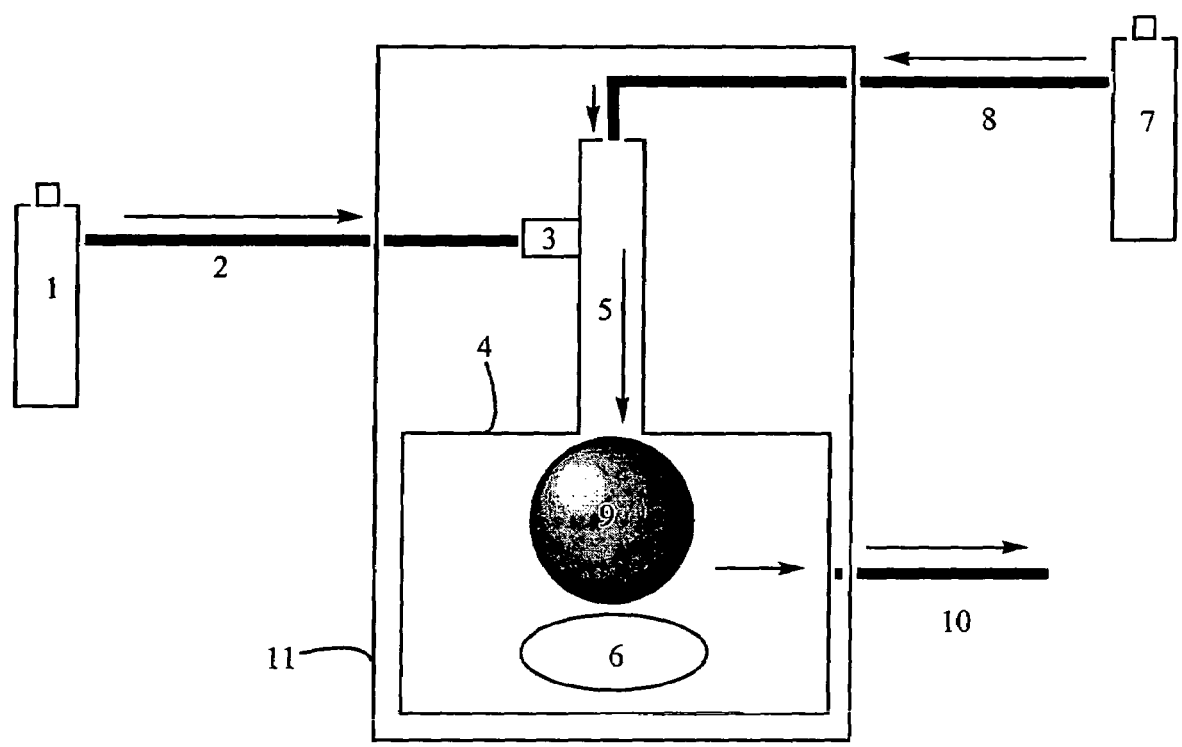
FIG. 1 is a representation of a film deposition tool used in the semiconductor industry for use with the compositions according to the present invention.

The compositions of present invention exhibit stability and significantly extend the shelf life of organohydrosiloxane products, allowing for greater flexibility in the handling of these products in chemical processes or semiconductor manufacturing. The resulting stabilization of siloxanes prevents the possibility of complete polymerization (i.e., solidification) of product in chemical delivery lines or valves, which lowers equipment maintenance and costs and reduces the time which the machinery is out of production. In addition, reducing the formation of higher molecular weight compounds allows homogeneous vaporization of the product without concern for the gradual deposition of higher molecular weight compounds in vapor delivery lines leading to more consistent, higher quality deposited films. It is furthermore an objective of this invention to provide a process of use of stabilized organohydrosiloxane compositions.

One important aspect of the present invention is that films deposited with the compositions of the present invention have been found to have properties similar to and/or better than those films deposited using existing compositions. Therefore, the compositions of the present invention can seamlessly replace existing compositions without requiring process changes and/or experiencing undesirable performance changes.

In one embodiment of the present invention, the organohydrosiloxane composition comprises:

A) one or more organohydrosiloxane compounds, each having at least one [—HSiR—O—] unit, wherein R=$C_1$-$C_{18}$ linear, branched, or cyclic alkyl, $C_1$-$C_{18}$ linear, branched, or cyclic alkoxy, or substituted or unsubstituted aryl; and B) an antioxidant compound of Formula (1), wherein the antioxidant compound is a phenolic compound and is present in a concentration from about 1 ppm to about 5,000 ppm and wherein $R^1$ through $R^5$ can each independently be H, OH, $C_1$-$C_{18}$ linear, branched, or cyclic alkyl, $C_1$-$C_{18}$ linear, branched, or cyclic alkoxy or substituted or unsubstituted aryl.

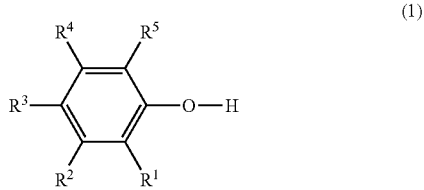

(1)

In another embodiment of the present invention, the organohydrosiloxane composition comprises:

a) one or more organohydrosiloxane compounds, each having at least one [—HSiR—O—] unit, wherein R=$C_1$-$C_{18}$ linear, branched, or cyclic alkyl, $C_1$-$C_{18}$ linear, branched, or cyclic alkoxy, or substituted or unsubstituted aryl;

b) an antioxidant compound of Formula (1), wherein the antioxidant compound is a phenolic compound and is present in a concentration from about 1 ppm to about 5,000 ppm and wherein $R^1$ through $R^5$ can each independently be H, OH, $C_1$-$C_{18}$ linear, branched, or cyclic alkyl, $C_1$-$C_{18}$ linear, branched, or cyclic alkoxy or substituted or unsubstituted aryl; and c) an alkoxysilane of formula $(R^6O)SiR^7R^8R^9$ shown in Formula (2), wherein the alkoxysilane compound is present in a concentration from about 1 ppm to about 5,000 ppm, and $R^6$ is a $C_1$-$C_{18}$ linear, branched, or cyclic alkyl or substituted or unsubstituted aryl and $R^7$, $R^8$, and $R^9$ are independently H, $C_1$-$C_{18}$ linear, branched, or cyclic alkyl, $C_1$-$C_{18}$ linear, branched, or cyclic alkoxy or substituted or unsubstituted aryl.

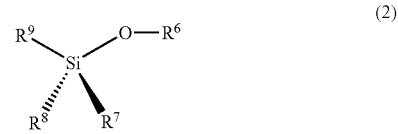

(2)

The present invention is also directed to a process of using an organohydrosiloxane composition for forming a layer of carbon-doped silicon oxide on a wafer.

In an embodiment of the present invention, the process comprises the steps of:

a) providing an organohydrosiloxane composition in a container, a film deposition tool, a means for connecting the container and the film deposition tool, a stream of gas and a substrate within the film deposition tool;

b) introducing the organohydrosiloxane composition into a gas stream thereby forming a process vapor;

c) transporting the vapor of the organohydrosiloxane composition to the substrate within the film deposition tool; and d) using one or more means, such as plasma, heat or a chemical reaction, to decompose the organohydrosiloxane composition in order to form a layer of carbon-doped silicon oxide on the substrate, wherein the organohydrosiloxane composition comprises:

1) one or more organohydrosiloxane compounds, each having at least one [—HSiR—O—] unit, wherein R=$C_1$-$C_{18}$ linear, branched, or cyclic alkyl, $C_1$-$C_{18}$ linear, branched, or cyclic alkoxy, or substituted or unsubstituted aryl; and 2) an antioxidant compound of Formula (1), wherein the antioxidant compound is a phenolic compound and is present in a concentration from about 1 ppm to about 5,000 ppm and wherein $R^1$ through $R^5$ can each independently be H, OH, $C_1$-$C_{18}$ linear, branched, or cyclic alkyl, $C_1$-$C_{18}$ linear, branched, or cyclic alkoxy or substituted or unsubstituted aryl.

In another embodiment of the present invention, the process of using an organohydrosiloxane composition for forming a layer of carbon-doped silicon oxide on a wafer comprises the steps of:

a) providing an organohydrosiloxane composition in a container, a film deposition tool, a means for connecting the container and the film deposition tool, a stream of gas and a substrate within the film deposition tool;

b) introducing the organohydrosiloxane composition into a gas stream thereby forming a process vapor;

c) transporting the vapor of the organohydrosiloxane composition to the substrate within the film deposition tool; and d) using one or more means, such as plasma, heat or a chemical reaction, to decompose the organohydrosiloxane composition in order to form a layer of carbon-doped silicon oxide on the substrate, wherein the organohydrosiloxane composition comprises:

1) one or more organohydrosiloxane compounds, each having at least one [—HSiR—O—] unit, wherein R=$C_1$-$C_{18}$ linear, branched, or cyclic alkyl, $C_1$-$C_{18}$ linear, branched, or cyclic alkoxy, or substituted or unsubstituted aryl;

2) an antioxidant compound of Formula (1), wherein the antioxidant compound is a phenolic compound and is present in a concentration from about 1 ppm to about 5,000 ppm and wherein $R^1$ through $R^5$ can each independently be H, OH, $C_1$-$C_{18}$ linear, branched, or cyclic alkyl, $C_1$-$C_{18}$ linear, branched, or cyclic alkoxy or substituted or unsubstituted aryl; and 3) an alkoxysilane of formula $(R^6O)SiR^7R^8R^9$ shown in Formula (2), wherein the alkoxysilane compound is present in a concentration from about 1 ppm to about 5,000 ppm, and $R^6$ is a $C_1$-$C_{18}$ linear, branched, or cyclic alkyl or substituted or unsubstituted aryl and $R^7$, $R^8$, and $R^9$ are independently H, $C_1$-$C_{18}$ linear, branched, or cyclic alkyl, $C_1$-$C_{18}$ linear, branched, or cyclic alkoxy or substituted or unsubstituted aryl.

The organohydrosiloxane may be linear or cyclic. Suitable examples of linear organohydrosiloxane compounds of the present invention are those described by Formula (3) or alternatively in Formula (4). In Formulas (3) or (4), $R^{10}$ can be $C_1$-$C_{18}$ linear, branched, or cyclic alkyl, $C_1$-$C_{18}$ linear, branched, or cyclic alkoxy, or substituted or unsubstituted aryl, and $R^{11}$ through $R^{16}$ can each independently be H, $C_1$-$C_{18}$ linear, branched, or cyclic alkyl, $C_1$-$C_{18}$ linear, branched, or cyclic alkoxy, or substituted or unsubstituted aryl, x can range from 1 to about 20 and y can range from 0 to about 20. Additionally, x can equal 0 when at least one of $R^{11}$ through $R^{16}$ equals H. Examples of Formulas (3) and (4) include, but are not limited to, having $R^{10}$ through $R^{16}$ equal methyl, ethyl, propyl, butyl, phenyl, methylphenyl, cyclohexyl, isopropyl and additionally H for $R^{11}$ through $R^{16}$, where y can range from about 0 to about 10 and x can range from about 1 to about 10 or instead equal 0 if one of $R^{11}$ through $R^{16}$ equals H. Preferred examples of Formulas (3) and (4) include, but are not limited to, having $R^{10}$ through $R^{16}$ equal methyl, ethyl, propyl, butyl, cyclohexyl and additionally H for $R^{11}$ through $R^{16}$, where x can range from about 1 to about 8 and y can range from 0 to about 8. More preferred examples of Formulas (3) and (4) include, but are not limited to, having $R^{10}$ through $R^{16}$ methyl, ethyl, cyclohexyl and additionally H for $R^{11}$ through $R^{16}$, where x can range from about 1 to about 4 and y can range from about 1 to about 5. For Formulas (3) and (4) used in semiconductor applications, methyl is most preferred for $R^{10}$, methyl or H is most preferred for $R^{11}$ through $R^{16}$, and x can range from about 3 to about 4 while y can range from about 3 to about 4.

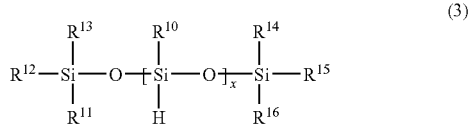

(3)

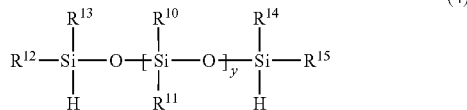

(4)

Suitable examples of linear organohydrosiloxanes described by Formula (3) include 1,1,1,3,3-pentamethyldisiloxane, 1,1,1,3,3-pentaethyldisiloxane, 1,1,1,3,3-pentaphenyldisiloxane, 1,1,1,3,3-penta(4-methylphenyl)disiloxane, 1,1,5,5-tetramethyl-3-ethyltrisiloxane, 1,1,5,5-tetraethyl-3-methyltrisiloxane, 1,1,3,5,5-pentamethyltrisiloxane, 1,1,3,5,5-pentaethyltrisiloxane, 1,1,3,5,5-pentaphenyltrisiloxane, 1,1,3,5,5-penta(4-methylphenyl)trisiloxane, 1,1,1,5,5,5-heptamethyl-3-ethyltrisiloxane, 1,1,1,5,5,5-heptaethyl-3-methyltrisiloxane, 1,1,1,3,5,5,5-heptamethyltrisiloxane, 1,1,1,3,5,5,5-heptaethyltrisiloxane, 1,1,1,3,5,5,5-heptaphenyltrisiloxane, 1,1,1,3,5,5,5-hepta(4-methylphenyl)trisiloxane, 1,1,3,5,7,7-hexamethyltetrasiloxane, 1,1,3,5,7,7-hexaethyltetrasiloxane, 1,1,3,5,7,7-hexaphenyltetrasiloxane, 1,1,3,5,7,7-hexa(4-methylphenyl)tetrasiloxane, 1,1,1,3,5,7,7-octamethyltetrasiloxane, 1,1,1,3,5,7,7,7-octaethyltetrasiloxane, 1,1,1,3,5,7,7,7-octaphenyltetrasiloxane, 1,1,1,3,5,7,7,7-octa(4-methylphenyl)tetrasiloxane, 1,1,3,5,7,9,9-heptamethylpentasiloxane, 1,1,3,5,7,9,9-heptamethylpentasiloxane, 1,1,3,5,7,9,9-heptaethylpentasiloxane, 1,1,3,5,7,9,9-heptaphenylpentasiloxane, 1,1,3,5,7,9,9-hepta(4-methylphenyl)pentasiloxane, 1,1,1,3,5,7,9,9,9-nonamethylpentasiloxane, 1,1,1,3,5,7,9,9,9-nonaethylpentasiloxane, 1,1,1,3,5,7,9,9,9-nonaphenylpentasiloxane, 1,1,1,3,5,7,9,9,9-nona(4-methylphenyl)pentasiloxane, 1,1,3,5,7,9,11,11-octaamethylhexasiloxane, 1,1,3,5,7,9,11,11-octaethylhexasiloxane, 1,1,3,5,7,9,11,11-octaphenylhexasiloxane, 1,1,3,5,7,9,11,11-octa(4-methylphenyl)hexasiloxane, 1,1,1,3,5,7,9,11,11,11-decamethylhexasiloxane, 1,1,1,3,5,7,9,11,11,11-decaethylhexasiloxane, 1,1,1,3,5,7,9,11,11,11-decaphenylhexasiloxane, 1,1,1,3,5,7,9,11,11,11-deca(4-methylphenyl)hexasiloxane.

Suitable examples of linear organohydrosiloxanes described by Formula (4) include 1,1-diethyl-3,3-dimethyldisiloxane, 1,1,3,3-tetramethyldisiloxane, 1,1,3,3-tetraethyltrisiloxane, 1,1,3,3-tetraphenyldisiloxane, 1,1,3,3-tetra(4-methylphenyl)disiloxane, 1,1,5,5-tetramethyl-3,3-diethyltrisiloxane, 1,1,5,5-tetraethyl-3,3-dimethyltrisiloxane, 1,1,3,3,5,5-hexamethyltrisiloxane, 1,1,3,3,5,5-hexaethyltrisiloxane, 1,1,3,3,5,5-hexaphenyltrisiloxane, 1,1,3,3,5,5-hexa(4-methylphenyl)trisiloxane, 1,1,3,3,5,5,7,7-octamethyltetrasiloxane, 1,1,3,5,7,7-octaethyltetrasiloxane, 1,1,3,3,5,5,7,7-octaphenyltetrasiloxane, 1,1,3,3,5,5,7,7-octa(4-methylphenyl)tetrasiloxane, 1,1,3,3,5,5,7,7,9,9-decamethylpentasiloxane, 1,1,3,3,5,5,7,7,9,9-decaethylpentasiloxane, 1,1,3,3,5,5,7,7,9,9-decaphenylpentasiloxane, 1,1,3,3,5,5,7,7,9,9-deca(4-methylphenyl)pentasiloxane, 1,1,3,3,5,5,7,7,9,9,11,11-dodecaamethylhexasiloxane, 1,1,3,3,5,5,7,7,9,9,11,11-dodecaethylhexasiloxane, 1,1,3,3,5,5,7,7,9,9,11,11-dodecaphenylhexasiloxane, and 1,1,3,3,5,5,7,7,9,9,11,11-dodeca(4-methylphenyl)hexasiloxane.

Suitable examples of cyclic organohydrosiloxane compounds of the invention are those described by Formula (5). In Formula (5), each $R^{17}$ can independently be $C_1$-$C_{18}$ linear, branched, or cyclic alkyl, $C_1$-$C_{18}$ linear, branched, or cyclic alkoxy, or substituted or unsubstituted aryl and z can range from about 2 to about 21. Examples of Formula (5) include, but are not limited to having $R^{17}$ equal to methyl, ethyl, propyl, butyl, phenyl, methylphenyl, cyclohexyl, or isopropyl, where z can range from about 2 to about 21. Preferred examples of Formula (5) include having $R^{17}$ equal to methyl, ethyl, propyl, butyl, or cyclohexyl, where z can range from about 2 to about 11. More preferred examples of Formula (5) include having $R^{17}$ equal methyl, ethyl, or cyclohexyl, where z can range from about 2 to about 7. Most preferred examples of Formula (5) include having $R^{17}$ equal methyl and z can range from about 2 to about 5 for use in semiconductor applications.

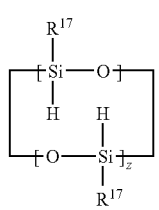

(5)

Examples of cyclic siloxanes described by Formula (5) include 1,3,5-trimethylcyclotrisiloxane, 1,3,5-triethylcyclotrisiloxane, 1,3,5-triphenylcyclotrisiloxane, 1,3,5-tri(4-methylphenyl)cyclotrisiloxane, 1,3,5,7-tetramethylcyclotetrasiloxane, 1,3,5,7-tetraethylcyclotetrasiloxane, 1,3,5,7-tetraphenylcyclotetrasiloxane, 1,3,5,7-tetra(4-methylphenyl)cyclotetrasiloxane, 1,5-dimethyl-3,7-diethylcyclotetrasiloxane, 1,3-dimethyl-5,7-diethylcyclotetrasiloxane, 1,3,5,7,9-pentamethylcyclopentasiloxane, 1,3,5,7,9-pentaethylcyclopentasiloxane, 1,3,5,7,9-pentaphenylcyclopentasiloxane, 1,3,5,7,9-penta(4-methylphenyl)cyclopentasiloxane, 1,3,5,7,9,11-hexamethylcyclohexasiloxane, 1,3,5,7,9,11-hexaethylcyclohexasiloxane, 1,3,5,7,9,11-hexaphenylcyclohexasiloxane, 1,3,5,7,9,11-hexa(4-methylphenyl)cyclohexasiloxane, 1,5,9-trimethyl-3,7,11-triethylcyclohexasiloxane, and 1,3,5-trimethyl-7,9,11-triethylcyclohexasiloxane.

Cyclic organohydrosiloxanes, as in Formula (5), are preferred for use in the semiconductor industry due to their greater ability to form polymeric species when compared to linear compounds, as in Formulas (3) or (4). Preferred examples of cyclic organohydrosiloxanes include 1,3,5-trimethylcyclotrisiloxane, 1,3,5-triethylcyclotrisiloxane, 1,3,5,7-tetramethylcyclotetrasiloxane, 1,3,5,7-tetraethylcyclotetrasiloxane, 1,3,5,7,9-pentamethylcyclopentasiloxane and 1,3,5,7,9-pentaethylcyclopentasiloxane. 1,3,5-trimethylcyclotrisiloxane and 1,3,5,7-tetramethylcyclotetrasiloxane are most preferred for use in the semiconductor industry.

The properties of a layer deposited on a substrate, such as dielectric constant, film hardness and refractive index, are influenced by changing the composition of the chemistry that is fed into the film deposition tool. For example, the dielectric constant may range from about 2.0 to about 4.0, depending on the processing conditions used. Materials with a dielectric constant below about 2.7 are preferred for newer semiconductor devices. The layer properties can be tuned by changing the identity of the organohydrosiloxane, by using a different flow gas, or by using one or more different reactive gases.

Another means to affect the layer properties is to use a combination of organohydrosiloxanes, or to combine an organohydrosiloxane with other silicon-containing molecules such as silanes, polysilanes, siloxanes, polysiloxanes and the like. The decision to combine organohydrosiloxanes or to use them in combination with other silicon compounds, and the proportion and method in which they are combined, is wholly dependent on the desired effect one wants to achieve. In such a combination, the relative ratios may range from about 1% to about 99% in the case of a two-component system and from about 1% to about 99% in a three-component system with the proviso that the sum of the three components equals about 100% of the composition excluding any additives.

Suitable phenolic antioxidants of the invention are described by Formula (1) where $R^1$ through $R^5$ can each independently be H, OH, $C_1$-$C_{18}$ linear, branched, or cyclic alkyl, $C_1$-$C_{18}$ linear, branched, or cyclic alkoxy or substituted or unsubstituted aryl. Examples of suitable $R^1$ through $R^5$ include H, OH, methyl, ethyl, propyl, iso-propyl, butyl, iso-butyl, tert-butyl, methoxy, ethoxy, propoxy, iso-propoxy, butoxy or tert-butoxy. Preferred examples of $R^1$ through $R^5$ in Formula (1) include H, OH, methyl, ethyl, methoxy, ethoxy, and tert-butyl. Most preferred examples are H and methoxy, where $R^1$, $R^2$, $R^4$ and $R^5$ are H and $R^3$ is methoxy.

Suitable examples of Formula (1) include, but are not limited to, phenol, hydroquinone, 4-methylphenol, 3-methylphenol, 2-methylphenol, 4-ethylphenol, 4-propylphenol, 4-iso-propylphenol, 4-butylphenol, 4-sec-butylphenol, 4-iso-butylphenol, 4-tert-butylphenol, 4-methoxyphenol, 3-methoxyphenol, 2-methoxyphenol, 4-ethoxyphenol, 4-propoxyphenol, 4-butoxyphenol, 2,4-di-tert-butylphenol, 2-(1-methylbutyl)phenol, 2-(benzyloxy)phenol, 2-tert-butyl-6-methylphenol, 3,4,5-trimethoxyphenol, 3-ethoxy-4-methylphenol, 4-benzyloxyphenol, 4-benzyl-2,6-di-tert-butylphenol, 2-(2-butenyl)phenol, 2-(4-methylbenzyl)phenol, 2,6-di-tert-butyl-4-methylphenol (BHT), 1,2-dihydroxybenzene, 2,4,6-tris-benzyloxyphenol, 2,4-dicyclohexyl-5-methylphenol and 6-tert-butyl-1,2-dihydroxybenzene. Preferred antioxidants of Formula (1) include phenol, 4-methylphenol, 3-methylphenol, 2-methylphenol, 4-methoxyphenol, 3-methoxyphenol, and 2-methoxyphenol. The most preferred antioxidant of Formula (1) is 4-methoxyphenol.

A suitable concentration of phenolic additive may be obtained from a range of concentrations, such as from about 1 ppm to about 5000 ppm. Suitable concentration ranges can be defined by defining a low end of suitable concentrations and a high end of suitable concentrations.

The low end of the suitable concentration range for the phenolic additive may be from about 1 ppm to about 200 ppm. Suitable concentrations for the low end concentration range include, but are not limited to, 1 ppm, 5 ppm, 10 ppm, 25 ppm, 50 ppm, 100 ppm, 150 ppm, and 200 ppm.

The high end of the suitable concentration range is not critical for stabilization of the compositions, but may be limited by some considerations of the deposited film purity and solubility of the phenolic additive in the organohydrosiloxane. A suitable concentration range for the high end phenolic additive concentration may be from about 1000 ppm to about 5000 ppm. Examples of suitable concentrations for the high end include but are not limited to 1000 ppm, 1500 ppm, 2000 ppm, 2500 ppm, 3000 ppm, 3500 ppm, 4000 ppm, 4500 ppm, and 5000 ppm.

An example of a suitable concentration of phenolic additive is a range from 1 to about 1000 ppm. A preferred concentration of phenolic additive is a range from about 10 to about 500 ppm. A more preferred concentration of a phenolic additive is a range from about 25 to about 200 ppm. A most preferred concentration of a phenolic additive is a range from about 50 to about 100 ppm.

The concentration of phenolic additive of Formula (1) may be a single phenolic additive or a mixture of phenolic additives. The mixture of phenolic additive may be in any relative proportion.

Additives useful for the semiconductor industry are limited to species that are volatile, having a boiling point <300° C., and most preferably having a boiling point close to that of the product being stabilized. The boiling point of TMCTS is 135° C., so it is most desirable to use an additive having a boiling point near or below 135° C. Further, the application in the semiconductor industry will dictate the properties of the precursor selection. For example, formation of interlayer dielectric (ILD) films restricts precursor selection to use only silicon, oxygen, carbon and hydrogen due to compatibility issues with surrounding layers in a chip. The selection of radical inhibitors must also follow this basis, so nitrogen, sulfur and phosphorous that are found in common radical inhibitors such as lecithin and lipoic acid must be avoided. Keeping in mind the volatility and elemental restrictions for inhibitors useful in the semiconductor industry, the preferred choices are phenol, hydroquinone, 4-methylphenol and 4-methoxyphenol, where the boiling points for these products range from 182° C. to 243° C., respectively.

Examples of suitable alkoxysilane additive compounds are described by Formula (2) where $R^6$ is a $C_1$-$C_{18}$ linear, cyclic or branched alkyl or substituted or unsubstituted aryl; $R^7$, $R^8$, and $R^9$ are independently H, $C_1$-$C_{18}$ linear, cyclic or branched alkyl, $C_1$-$C_{18}$ linear, cyclic or branched alkoxy or substituted or unsubstituted aryl. Examples of suitable $R^6$ groups include, but are not limited to, methyl, ethyl, propyl, iso-propyl, butyl, iso-butyl, sec-butyl, tert-butyl, phenyl or methylphenyl. Examples of suitable $R^7$, $R^8$, and $R^9$ groups include, but are not limited to, H, methyl, ethyl, propyl, iso-propyl, butyl, iso-butyl, sec-butyl, tert-butyl, methoxy, ethoxy, propoxy, iso-propoxy, butoxy, iso-butoxy, sec-butoxy, tert-butoxy, phenyl or methylphenyl. Preferred examples of $R^6$ in Formula (2) include, but are not limited to, methyl, ethyl and propyl. The most preferred example of $R^6$ is methyl. Preferred examples of $R^7$, $R^8$ and $R^9$ include, but are not limited to, methyl, ethyl, propyl, methoxy, ethoxy and propoxy. Most preferred examples of $R^6$ are methyl and ethyl. Most preferred examples of $R^7$, $R^8$ and $R^9$ include methyl, ethyl, methoxy and ethoxy.

Suitable examples of Formula (2) include but are not limited to trimethylmethoxysilane, triethylmethoxysilane, tripropylmethoxysilane, triphenylmethoxysilane, tri(4-methylphenyl)methoxysilane, dimethyldimethoxysilane, diethyldimethoxysilane, dipropyldimethoxysilane, diphenyldimethoxysilane, di(4-methylphenyl)dimethoxysilane, methyltrimethoxysilane, ethyltrimethoxysilane, propyltrimethoxysilane, phenyltrimethoxysilane, 4-methylphenyltrimethoxysilane, trimethylethoxysilane, triethylethoxysilane, tripropylethoxysilane, triphenylethoxysilane, tri(4-methylphenyl)ethoxysilane, dimethyldiethoxysilane, diethyldiethoxysilane, dipropyldiethoxysilane, diphenyldimethoxysilane, di(4-methylphenyl)diethoxysilane, methyltriethoxysilane, ethyltriethoxysilane, propyltriethoxysilane, phenyltriethoxysilane, 4-methylphenyltriethoxysilane, trimethylpropoxysilane, triethylpropoxysilane, tripropylpropoxysilane, triphenylpropoxysilane, tri(4-methylphenyl)propoxysilane, dimethyldipropoxysilane, diethyldipropoxysilane, dipropyldipropoxysilane, diphenyldipropoxysilane, di(4-methylphenyl)dipropoxysilane, methyltripropoxysilane, ethyltripropoxysilane, propyltripropoxysilane, phenyltripropoxysilane, 4-methylphenyltripropoxysilane, trimethylbutoxysilane, triethylbutoxysilane, tripropylbutoxysilane, triphenylbutoxysilane, tri(4-methylphenyl)butoxysilane, dimethyldibutoxysilane, diethyldibutoxysilane, dipropyldibutoxysilane, diphenyldibutoxysilane, di(4-methylphenyl)dibutoxysilane, methyltributoxysilane, ethyltributoxysilane, propyltributoxysilane, phenyltributoxysilane, 4-methylphenyltributoxysilane, trimethylphenoxysilane, triethylphenoxysilane, tripropylphenoxysilane, triphenylphenoxysilane, tri(4-methylphenyl)phenoxysilane, dimethyldiphenoxysilane, diethyldiphenoxysilane, dipropyldiphenoxysilane, diphenyldiphenoxysilane, di(4-methylphenyl)diphenoxysilane, methyltriphenoxysilane, ethyltriphenoxysilane, propyltriphenoxysilane, phenyltriphenoxysilane, 4-methylphenyltriphenoxysilane, trimethyl(4-methylphenoxy)silane, triethyl(4-methylphenoxy)silane, tripropyl(4-methylphenoxy)silane, triphenyl(4-methylphenoxy)silane, tri(4-methylphenyl)(4-methylphenoxy)silane, dimethyldi(4-methylphenoxy)silane, diethyldi(4-methylphenoxy)silane, dipropyldi(4-methylphenoxy)silane, diphenyldi(4-methylphenoxy)silane, di(4-methylphenyl)di(4-methylphenoxy)silane, methyltri(4-methylphenoxy)silane, ethyltri(4-methylphenoxy)silane, propyltri(4-methylphenoxy)silane, phenyltri(4-methylphenoxy)silane and 4-methylphenyltri(4-methylphenoxy)silane. Preferred examples of Formula (2) include trimethylmethoxysilane, triethylmethoxysilane, tripropylmethoxysilane, dimethyldimethoxysilane, diethyldimethoxysilane, dipropyldimethoxysilane, trimethylethoxysilane, triethylethoxysilane, tripropylethoxysilane, dimethyldiethoxysilane, diethyldiethoxysilane, dipropyldiethoxysilane, trimethylpropoxysilane, triethylpropoxysilane, tripropylpropoxysilane, dimethyldipropoxysilane, diethyldipropoxysilane, dipropyldipropoxysilane, trimethylbutoxysilane, triethylbutoxysilane, tripropylbutoxysilane, dimethyldibutoxysilane, diethyldibutoxysilane and dipropyldibutoxysilane. Most preferred examples of Formula (2) include trimethylmethoxysilane, triethylmethoxysilane, tripropylmethoxysilane, trimethylethoxysilane, triethylethoxysilane, tripropylethoxysilane, trimethylpropoxysilane, triethylpropoxysilane, tripropylpropoxysilane, trimethylbutoxysilane, triethylbutoxysilane, and tripropylbutoxysilane.

A suitable concentration of alkoxysilane additive compounds of Formula (2) may be obtained from a range of concentrations, such as from about 1 ppm to about 5000 ppm. A suitable concentration range can be defined by defining a low end of suitable concentrations and a high end of suitable concentrations.

The low end of the suitable concentration ranges for the alkoxysilane additive compound may be from about 1 ppm to about 500 ppm. Suitable concentrations for the low end concentration range include but are not limited to 1 ppm, 5 ppm, 10 ppm, 25 ppm, 50 ppm, 100 ppm, 200 ppm, 300 ppm, 400 ppm and 500 ppm.

The high end of the suitable concentration ranges for the alkoxysilane additive compound may be from about 1000 ppm to about 5000 ppm. Examples of suitable concentrations for the high-end concentration range include but are not limited to 1000 ppm, 1500 ppm, 2000 ppm, 2500 ppm, 3000 ppm, 3500 ppm, 4000 ppm, 4500 ppm, and 5000 ppm.

The concentration of alkoxysilane additive of Formula (2) may be a single alkoxysilane additive or a mixture of alkoxysilane additives, and the mixture of alkoxysilane additives may be in any relative proportion.

A preferred concentration when both alkoxysilane additives and phenolic additives are employed, varies based on the identity of the siloxane, the phenolic additive and the alkoxysilane additive. In general, it is preferred to have the concentration of the alkoxysilane exceed that of the phenolic additive when the two are used in combination. This is due to solubility issues that can be encountered when using a greater percentage of solid phenolic additive, especially in higher molecular weight organohydrosiloxanes. Further, it can be beneficial to dissolve a solid, phenolic additive in an alkoxysilane prior to stabilizing an organohydrosiloxane. This allows for addition of a single, homogeneous and easily metered liquid without the concern for having problems with washing solids from container to another.

An example of a suitable concentration of alkoxysilane additive is a range from about 1 to about 5000 ppm in addition to a suitable concentration of phenolic additive being from about 1 to about 1000 ppm. An example of a preferred concentration of alkoxysilane additive is a range from about 10 to about 2500 ppm in addition to a preferred concentration of phenolic additive being from about 10 to about 500 ppm. An example of a more preferred concentration of alkoxysilane additive is a range from about 100 to about 1000 ppm in addition to a more preferred concentration of phenolic additive being from about 25 to about 200 ppm. An example of a most preferred concentration of alkoxysilane additive is a range from about 250 to about 500 ppm in addition to a most preferred concentration of phenolic additive being from about 50 to about 100 ppm.

Referring to FIG. 1, chemical precursors of the type described by Formulas (3), (4) and (5) are typically packaged, shipped and stored in stainless steel containers (1) to retain product quality for the maximum amount of time. To extend shelf life of a precursor, it is common to package the product under an inert gas such as nitrogen, argon or helium. The product container is then connected to chemical delivery equipment that transfers the chemical by a precisely controlled means, to retain product and process purity and consistency, to process equipment, referred to here as a film deposition tool.

The precursor is transported from the container (1), through chemical delivery lines (2), to a vaporizer or misting apparatus (3) housed in the film deposition tool (11). The precursor can be transported from the container (1) through the delivery line (2) to the vaporizer or misting apparatus (3) by a variety of means, including, but not limited to, pressurization of the container with an inert gas, use of a mechanical pumping mechanism, gravity feed, or combinations thereof.

A suitable precursor flow rate can range from about 0.01 to about 10 mL/minute. The vaporizer or misting apparatus (3) serves as a means to rapidly convert liquid precursor to a vapor or mist, and it can use various techniques, such as heat, high pressure gas, or other means to accomplish this task, though conversion of the precursor from a liquid to a gaseous state may take place either in the vaporizer or misting apparatus (3) or in the chemical vapor process line (5). The precursor is injected in the form of a vapor or mist into the chemical vapor process line (5) that is commonly heated between about 30° C. and about 120° C. to prevent the precursor vapor from condensing inside the line (5). This line is connected to the process chamber (4) inside the film deposition tool (11), and substrate (6) is housed within the process chamber (4). The process chamber (4) and chemical vapor process line (5) may be operated at ambient pressure (i.e., 760 torr), but it is also common to operate below atmospheric pressure, from about 0.01 torr to about 700 torr, to enhance vaporization of the precursor and to help keep the precursor in the vapor phase.

The precursor vapor is transported through the chemical vapor process line (5) to the substrate (6) in the process chamber (4) by a stream of gas flowing past the vaporizer or misting apparatus (3). The stream of gas is supplied from a source tank (7) and flows through a gas delivery line (8) to the chemical vapor process line (5). The stream of gas, having a flow rate of about 5 sccm to about 10,000 sccm, is often heated to enhance vaporization of the precursor and to help keep the precursor in the vapor phase. The gas used may be inert, such as nitrogen, helium or argon, chosen simply to act as a means to transport the precursor vapor to the substrate, or it may be a reactive gas, such as oxygen, ozone, ammonia, nitrous oxide, carbon dioxide, carbon monoxide, $SiH_4$, silanes, silicon tetrafluoride, hydrazine and the like. Certain reactive gases containing elements not commonly used in the deposition of a low k film, such as ammonia that contains nitrogen, may be used in situations where modification of a deposited film is desired. It is not uncommon to complete the deposition process of a low k film by doping the top of the film with nitrogen by bleeding ammonia gas into the final phase of the deposition process.

As the precursor vapor is transported to the substrate (6), it may be mixed with one or more reactants, in addition to the transport gas, to enhance its deposition onto the substrate or to dope the resulting film in a particular manner. The reactants may be reactive gases as mentioned above, or they may be other chemical precursors such as amines, aminoalcohols, silanes, siloxanes, alkanes, alkenes, alkynes, alcohols, esters, ketones, aldehydes, carboxylic acids, arsines, alkylarsenates, phosphines, alkylphosphates, boranes, alkylborates, and the like, or any combinations thereof. By way of example, the following precursors may be used in the present invention: methylamine, dimethylamine, 2-(dimethylamino)ethanol, diethylsilane, vinylmethyldimethoxysilane, octane, cyclobutene, trimethylsilylacetylene, t-butanol, methylbenzoate, acetone, benzaldehyde or acetic acid, and dopant chemicals, such as, arsine, trimethylarsenate, triethylarsenate, phosphine, trimethylphosphate, triethylphosphate, trimethylphosphite, triethylphosphite, diborane, trimethylborate, and triethylborate. The reactants are carefully selected to enhance the deposition of precursor on the substrate, and to modify the chemical identity and properties of the layer deposited onto the substrate. These reactants can be introduced into the film deposition tool (11) by various means and at various locations in the process, depending on the desired effect. It is most convenient to introduce a reactant into the film deposition tool (11) in gaseous form, so it would be necessary to have a additional vaporizer or misting apparatus in the case where liquid reactants are used. An additional vaporizer or misting apparatus, or gas delivery line used to introduce a reactant can be placed near the point where the gas delivery line (8) meets the chemical vapor process line (5), upstream or downstream of the vaporizer or misting apparatus, directly into or near the plasma (9), and/or somewhere on the sides, top, or bottom of the film process chamber (4) of the film deposition tool (11).

The precursor vapor, and potential reactants, may also experience other conditions used to enhance deposition, such as heat or plasma (9). The precursor vapor may be preheated to between about 100° C. and about 800° C. before contact with the substrate to enhance the deposition of the precursor on the substrate. A plasma may also be used to add energy to the precursor vapor and enhance the deposition. Additionally, the plasma may be pulsed on and off to change the properties of the deposited film. The plasma power and pulse duration are carefully selected to enhance the deposition of precursor on the substrate, and to modify the chemical identity and properties of the layer deposited onto the substrate. The plasma may also be applied over a range of frequencies, where the high and low frequency plasma power may range from about 0 to several kilowatts. The substrate may also have a bias of between about 0 and about −400 VDC to enhance material transport to the substrate. The substrate may be heated from about 25° C. to about 500° C. to either cause thermal breakdown of the precursor on the substrate, or may be used to enhance the deposition of precursor on the substrate.

If only organohydrosiloxane and inert gas are used in this deposition process, the resulting film will be composed of Si, O, C and H. If oxygen is used in the gas stream, the amount of oxygen in the film can be increased. Carbon and nitrogen can be added by using carbon or nitrogen containing reactants. In addition, arsenic, boron and phosphorous can be added by using reactants containing these compounds, as previously described. The film that is deposited onto a substrate is wholly dependent on the reactants that contact it. Unreacted materials are exhausted through an exhaust line (10).

EXAMPLES

A series of tests were devised to compare the decomposition of pure TMCTS under various conditions with TMCTS that has been stabilized with additives. In these tests, approximately 5 grams of stabilized or unstabilized TMCTS sample was placed in a glass ampoule. To remove adventitious gas impurities from the sample before it was sealed, the sample was frozen in liquid nitrogen, the headspace of the ampoule was evacuated under dynamic vacuum, and then the sample was thawed under static vacuum. This process was repeated, and the sample was then flame sealed with or without a reactive gas. Control samples were sealed under vacuum, while reactive test samples were sealed under approximately 0.5 wt % of a reactive gas at ambient pressure.

The reactive gases that were used were oxygen and carbon dioxide. These gases were chosen because they are reactive components of air. Humid air was also used, and it was generated by flowing normal room air through a water bubbler in order to saturate the air with water vapor. This condition was used to simulate the worst-case scenario of exposing TMCTS to air at 100% humidity.

Samples were prepared for each potential reactive condition, and they were then exposed to a range of temperatures from 25 to 120° C. for a period of five days. After the experiment was complete, total decomposition was measured in each sample by gas chromatography (GC). The percentage of decomposition was derived by comparing gas chromatograms of samples taken before and after each experiment, where an increase in the concentration of any other species in the chromatogram indicated decomposition.

Examples 1-20

Results outlined in Table 1 show that for pure TMCTS, a small amount of decomposition was observed with samples heated above 60° C. when exposed to carbon dioxide or kept under vacuum. When samples were exposed to oxygen or air, more significant decomposition was seen at all temperatures. In similar experiments using 5,000 ppm trimethylmethoxysilane (TMMOS) as a stabilizing agent, no decomposition was observed from 60 to 120° C. under vacuum or with exposure to carbon dioxide. This indicates that the TMMOS stabilizer prevented decomposition when compared to pure TMCTS under similar conditions. However, TMMOS did not stabilize TMCTS in the presence of oxygen.

TABLE 1

| Example # | T (C.) | Reactive Gas | Pure TMCTS % Decomp | TMCTS + 0.5 wt % TMMOS % Decomp | TMCTS + 100 ppm MHQ % Decomp | TMCTS + 100 ppm MHQ + 0.5 wt % TMMOS % Decomp |
|---|---|---|---|---|---|---|
| 1 | 25 | Vacuum | 0 | 0 | 0 | 0 |
| 2 | 60 | Vacuum | 0.04 | 0 | 0 | 0 |
| 3 | 80 | Vacuum | 0.01 | 0 | 0 | 0 |
| 4 | 90 | Vacuum | 0.02 | 0 | 0 | 0 |
| 5 | 120 | Vacuum | 0.03 | 0 | 0.06 | 0.01 |
| 6 | 25 | CO2 | 0 | 0 | 0 | 0 |
| 7 | 60 | CO2 | 0.02 | 0 | 0 | 0 |
| 8 | 80 | CO2 | 0.02 | 0 | 0 | 0 |
| 9 | 90 | CO2 | 0.02 | 0 | 0 | 0 |
| 10 | 120 | CO2 | 0.01 | 0.01 | 0.01 | 0.02 |
| 11 | 25 | O2 | 0.04 | 0.00 | 0 | 0 |
| 12 | 60 | O2 | 4.94 | 5.64 | 0 | 0 |
| 13 | 80 | O2 | 4.83 | 5.17 | 0 | 0 |
| 14 | 90 | O2 | 4.87 | 6.21 | 0 | 0 |
| 15 | 120 | O2 | 5.28 | 6.39 | 0.16 | 0.05 |
| 16 | 25 | Air | 1.00 | No Data | No Data | 0 |
| 17 | 60 | Air | 1.19 | No Data | No Data | 0 |
| 18 | 80 | Air | 1.25 | No Data | No Data | 0 |
| 19 | 90 | Air | 1.29 | No Data | No Data | 0 |
| 20 | 120 | Air | 0.98 | No Data | No Data | 0.06 |

The results in Table I show that, when 4-methoxyphenol (MHQ) was used, it proved to be a very effective stabilizer at all temperatures, with no observable decomposition of TMCTS up to 90° C., and only minimal decomposition at 120° C. The results also demonstrate that the use of MHQ in combination with TMMOS gave slightly better results at 120° C. This is most apparent in Example 15, where the use of MHQ and TMMOS reduced the total percent decomposition from 0.16% to 0.05%.

Examples 21-27

A range of additive concentrations was then tested to determine the 15 minimum amount of additive necessary to stabilize TMCTS effectively. Samples of TMCTS were prepared with concentrations of MHQ from 0 to 5000 ppm, and the samples were sealed in glass ampoules under an oxygen ambient as described above. The samples were heated at 120° C. for five days, and then the total decomposition was measured in each sample by GC. The percentage of decomposition was derived by comparing gas chromatograms of samples taken before and after each experiment, where an increase in the concentration of any other species in the chromatogram indicated decomposition. The results shown in Table 2 demonstrate that a concentration of MHQ as low as 10 ppm effectively stabilizes TMCTS against decomposition. Concentrations of MHQ up to 5000 ppm were shown to be effective in stabilizing TMCTS, although solubility issues were observed at concentrations of 1000 ppm or greater of MHQ. While these concentrations are soluble in TMCTS, it becomes increasingly difficult to initially dissolve MHQ in TMCTS as its concentration increases.

TABLE 2

| Example # | T (C.) | Reactive Gas | Quantity of MHQ | % Decomp |
|---|---|---|---|---|
| 21 | 120 | O2 | 0 ppm | 5.28 |
| 22 | 120 | O2 | 10 ppm | 0.66 |
| 23 | 120 | O2 | 100 ppm | 0.16 |
| 24 | 120 | O2 | 500 ppm | 0.05 |
| 25 | 120 | O2 | 1000 ppm | 0.06 |
| 26 | 120 | O2 | 2500 ppm | 0.12 |
| 27 | 120 | O2 | 5000 ppm | 0.20 |

Examples 28-36

Two more additive types were tested to determine their effectiveness to stabilize TMCTS, and these differed by varying substituents and substituent positions on a phenolic ring. Samples of TMCTS were prepared for each reactive condition using 100 ppm of the two different phenolic additives, phenol and cresol. The samples were heated at 120° C. for five days. The total decomposition was measured in each sample by GC. The percentage of decomposition was derived by comparing gas chromatograms of samples taken before and after each experiment, where an increase in the concentration of any other species in the chromatogram indicated decomposition. These results are compared beside results from Table 1 for pure TMCTS and TMCTS with 100 ppm of MHQ to demonstrate that phenol and m-cresol stabilize TMCTS equally as well as MHQ in the presence of oxygen and moist air.

TABLE 3

| Example # | T (C.) | Reactive Gas | Pure TMCTS % Decomp | 100 ppm MHQ % Decomp | 100 ppm Phenol % Decomp | 100 ppm Cresol % Decomp |
|---|---|---|---|---|---|---|
| 28 | 25 | Vacuum | 0 | 0 | 0 | 0 |
| 29 | 60 | Vacuum | 0.04 | 0 | 0.12 | 0 |
| 30 | 90 | Vacuum | 0.02 | 0 | 0.01 | 0.03 |
| 31 | 25 | O2 | 0.04 | 0 | 0 | 0 |
| 32 | 60 | O2 | 4.94 | 0 | 0 | 0 |
| 33 | 90 | O2 | 4.87 | 0 | 0 | 0.03 |
| 34 | 25 | Humid Air | 1.00 | No Data | 0 | 0 |
| 35 | 60 | Humid Air | 1.19 | No Data | 0 | 0 |
| 36 | 90 | Humid Air | 1.29 | No Data | 0.03 | 0.05 |

Examples 37-45

To demonstrate the ability to stabilize linear siloxanes, two types of linear siloxanes were chosen for further testing. 1,1,3,3,5,5-hexamethyltrisiloxane (HMTS), shown in Formula (6), was chosen for its terminal hydrogens on the terminal silicon atoms. 1,1,1,3,5,7,7,7-octamethyltetrasiloxane (OMTS), shown in Formula (7), was chosen for its hydrogens on central silicon atoms.

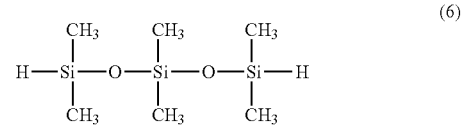

(6)

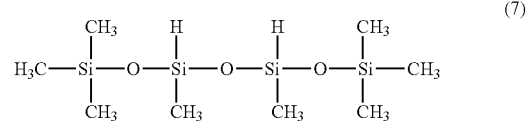

(7)

Samples of HMTS and OMTS were prepared for each reactive condition either without additives, or using 100 ppm of MHQ as shown in Table 4. The samples were heated at 120° C. for five days. The total decomposition was measured in each sample by GC. The percentage of decomposition was derived by comparing gas chromatograms of samples taken before and after each experiment, where an increase in the concentration of any other species in the chromatogram indicated decomposition. These results are compared to results from Table 1 for pure TMCTS and TMCTS with 100 ppm of MHQ. The data demonstrates that decomposition also occurs when linear organohydrosiloxanes are exposed to oxygen or humid air and that each type of linear organohydrosiloxane was stabilized using 100 ppm of MHQ.

TABLE 4

| Exam. # | T (C.) | Reactive Gas | Pure TMCTS % Decomp | TMCTS + 100 ppm % Decomp | Pure HMTS % Decomp | HMTS + 100 ppm % Decomp | Pure OMTS % Decomp | OMTS + 100 ppm % Decomp |
|---|---|---|---|---|---|---|---|---|
| 37 | 25 | Vacuum | 0 | 0 | 0 | 0 | 0.56 | 0 |
| 38 | 60 | Vacuum | 0.04 | 0 | 0.02 | 0.02 | 0.53 | 0 |
| 39 | 90 | Vacuum | 0.02 | 0 | 0.02 | 0 | 0.38 | 0 |

TABLE 4-continued

| Exam. # | T (C.) | Reactive Gas | Pure TMCTS % Decomp | TMCTS + 100 ppm % Decomp | Pure HMTS % Decomp | HMTS + 100 ppm % Decomp | Pure OMTS % Decomp | OMTS + 100 ppm % Decomp |
|---|---|---|---|---|---|---|---|---|
| 40 | 25 | O2 | 0.04 | 0 | 0 | 0 | 0 | 0 |
| 41 | 60 | O2 | 4.94 | 0 | 0 | 0 | 0 | 0 |
| 42 | 90 | O2 | 4.87 | 0 | 2.65 | 0.01 | 5.51 | 0 |
| 43 | 25 | Humid Air | 1.00 | No Data | 0.14 | 0 | 0.29 | 0 |
| 44 | 60 | Humid Air | 1.19 | No Data | 0.10 | 0 | 0 | 0 |
| 45 | 90 | Humid Air | 1.29 | No Data | 0.11 | 0 | 0.58 | 0 |

Example 46

The precursor, 1,3,5,7-tetramethylcyclotetrasiloxane, stabilized with 100 ppm of 4-methoxyphenol and 150 ppm of trimethylmethoxysilane is transferred, with the aid of nitrogen pressure, from a stainless steel container through a chemical delivery line to a fuel-injector style vaporizer at a flow rate of 5 mL/min. The precursor is vaporized into a chemical vapor process line that is heated to 80° C. and transported to a substrate using a reactive gas mixture composed of 1,000 sccm of carbon dioxide and 125 sccm of oxygen with the system base pressure held at 60 torr. During transport to the substrate, the precursor vapor and reactive gases are exposed to a high frequency plasma power of 1,500 W and a low frequency plasma power of 250 W. The substrate is heated to 250° C. with a substrate bias of −15 VDC. A carbon doped silicon oxide film is deposited on the substrate using these conditions.

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications that come within the scope of the appended claims.

What is claimed is:

1. An organohydrosiloxane composition consisting essentially of:
   a. one or more cyclic organohydrosiloxane compounds each compound having at least one [—HSiR—O—] unit, wherein R=$C_1$-$C_{18}$ linear, branched, or cyclic alkyl, $C_1$-$C_{18}$ linear, branched, or cyclic alkoxy, or substituted or unsubstituted aryl; and
   b. an antioxidant compound of Formula (1),

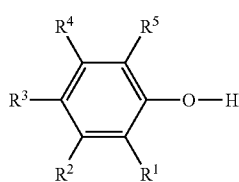

(1)

wherein the antioxidant compound is a phenolic compound present in an amount between about 1 ppm to about 5000 ppm, and wherein $R^1$ through $R^5$ are each independently H, $C_1$-$C_{18}$ linear, branched, or cyclic alkoxy or substituted or unsubstituted aryl; wherein the antioxidant compound is an alkoxy phenol.

2. The composition of claim 1, wherein said one or more cyclic compounds have a formula according to Formula (5),

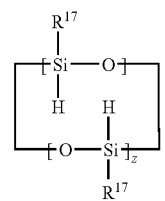

(5)

wherein $R^{17}$ is independently $C_1$-$C_{18}$ linear, branched, or cyclic alkyl, $C_1$-$C_{18}$ linear, branched, or cyclic alkoxy, or substituted or unsubstituted aryl; and z is about 2 to about 21.

3. The composition of claim 2, wherein $R^{17}$ is methyl, ethyl, propyl, butyl, or cyclohexyl; and z is about 2 to about 11.

4. The composition of claim 2, wherein said cyclic organohydrosiloxanes of Formula (5) are selected from the group consisting of: 1,3,5-trimethylcyclotrisiloxane, 1,3,5-triethylcyclotrisiloxane, 1,3,5-triphenylcyclotrisiloxane, 1,3,5-tri(4-methylphenyl)cyclotrisiloxane, 1,3,5,7-tetramethylcyclotetrasiloxane, 1,3,5,7-tetraethylcyclotetrasiloxane, 1,3,5,7-tetraphenylcyclotetrasiloxane, 1,3,5,7-tetra(4-methylphenyl)cyclotetrasiloxane, 1,5-dimethyl-3,7-diethylcyclotetrasiloxane, 1,3-dimethyl-5,7-diethylcyclotetrasiloxane, 1,3,5,7,9-pentamethylcyclopentasiloxane, 1,3,5,7,9-pentaethylcyclopentasiloxane, 1,3,5,7,9-pentaphenylcyclopentasiloxane, 1,3,5,7,9-penta(4-methylphenyl)cyclopentasiloxane, 1,3,5,7,9,11-hexamethylcyclohexasiloxane, 1,3,5,7,9,11-hexaethylcyclohexasiloxane, 1,3,5,7,9,11-hexaphenylcyclohexasiloxane, 1,3,5,7,9,11-hexa(4-methylphenyl)cyclohexasiloxane, 1,5,9-trimethyl-3,7,11-triethylcyclohexasiloxane, 1,3,5-trimethyl-7,9,11-triethylcyclohexasiloxane, and any combinations thereof.

5. The composition of claim 1, wherein said antioxidant compound of Formula (1) is selected from the group consisting of: 3-methoxyphenol, 2-methoxyphenol, 4-ethoxyphenol, 4-propoxyphenol, 4-butoxyphenol, 3,4,5-trimethoxyphenol, 4-benzyloxyphenol, 2,4,6-tris-benzyloxyphenol, and any combinations thereof.

6. The composition of claim 1, wherein said antioxidant compound is present in an amount about 1 ppm to about 1000 ppm.

7. The composition of claim 1, wherein said antioxidant compound is present in an amount about 25 ppm to about 200 ppm.

8. An organohydrosiloxane composition, comprising:
   a. one or more cyclic organohydrosiloxane compounds each compound having at least one [—HSiR—O—]

unit, wherein R=$C_1$-$C_{18}$ linear, branched, or cyclic alkyl, $C_1$-$C_{18}$ linear, branched, or cyclic alkoxy, or substituted or unsubstituted aryl; and b. an antioxidant compound of Formula (1),

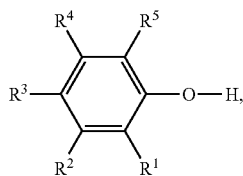

(1)

wherein the antioxidant compound is a phenolic compound present in an amount between about 1 ppm to about 5000 ppm, and wherein $R^1$ through $R^5$ are each independently H, $C_1$-$C_{18}$ linear, branched, or cyclic alkoxy or substituted or unsubstituted aryl provided that at least one of $R^1$ through $R^5$ is $C_1$-$C_{18}$ linear, branched, or cyclic alkoxy.

9. The composition of claim 8, wherein said one or more cyclic compounds have a formula according to Formula (5),

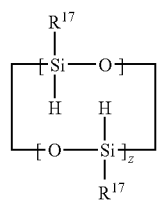

(5)

wherein $R^{17}$ is independently $C_1$-$C_{18}$ linear, branched, or cyclic alkyl, $C_1$-$C_{18}$ linear, branched, or cyclic alkoxy, or substituted or unsubstituted aryl; and z is about 2 to about 21.

10. The composition of claim 9, wherein $R^{17}$ is methyl, ethyl, propyl, butyl, or cyclohexyl; and z is about 2 to about 11.

11. The composition of claim 9, wherein said cyclic organohydrosiloxanes of Formula (5) are selected from the group consisting of: 1,3,5-trimethylcyclotrisiloxane, 1,3,5-triethylcyclotrisiloxane, 1,3,5-triphenylcyclotrisiloxane, 1,3,5-tri(4-methylphenyl)cyclotrisiloxane, 1,3,5,7-tetramethylcyclotetrasiloxane, 1,3,5,7-tetraethylcyclotetrasiloxane, 1,3,5,7-tetraphenylcyclotetrasiloxane, 1,3,5,7-tetra(4-methylphenyl)cyclotetrasiloxane, 1,5-dimethyl-3,7-diethylcyclotetrasiloxane, 1,3-dimethyl-5,7-diethylcyclotetrasiloxane, 1,3,5,7,9-pentamethylcyclopentasiloxane, 1,3,5,7,9-pentaethylcyclopentasiloxane, 1,3,5,7,9-pentaphenylcyclopentasiloxane, 1,3,5,7,9-penta(4-methylphenyl)cyclopentasiloxane, 1,3,5,7,9,11-hexamethylcyclohexasiloxane, 1,3,5,7,9,11-hexaethylcyclohexasiloxane, 1,3,5,7,9,11-hexaphenylcyclohexasiloxane, 1,3,5,7,9,11-hexa(4-methylphenyl)cyclohexasiloxane, 1,5,9-trimethyl-3,7,11-triethylcyclohexasiloxane, 1,3,5-trimethyl-7,9,11-triethylcyclohexasiloxane, and any combinations thereof.

12. The composition of claim 8, wherein said antioxidant compound of Formula (1) is selected from the group consisting of: 3-methoxyphenol, 2-methoxyphenol, 4-ethoxyphenol, 4-propoxyphenol, 4-butoxyphenol, 3,4,5-trimethoxyphenol, 4-benzyloxyphenol, 2,4,6-tris-benzyloxyphenol, and any combinations thereof.

13. The composition of claim 8, wherein said antioxidant compound is present in an amount about 1 ppm to about 1000 ppm.

14. The composition of claim 8, wherein said antioxidant compound is present in an amount about 25 ppm to about 200 ppm.

15. The composition of claim 8, wherein at least one of $R^1$ through $R^5$ is $C_1$-$C_{18}$ linear or branched alkoxy.

16. An organohydrosiloxane composition, consisting of:

a. one or more cyclic organohydrosiloxane compounds each compound having at least one [—HSiR—O—] unit, wherein R=$C_1$-$C_{18}$ linear, branched, or cyclic alkyl, $C_1$-$C_{18}$ linear, branched, or cyclic alkoxy, or substituted or unsubstituted aryl; and b. an antioxidant compound of Formula (1),

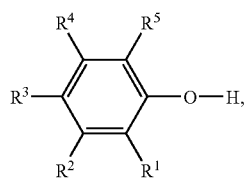

(1)

wherein the antioxidant compound is a phenolic compound present in an amount between about 1 ppm to about 5000 ppm, and wherein $R^1$ through $R^5$ are each independently H, $C_1$-$C_{18}$ linear, branched, or cyclic alkoxy or substituted or unsubstituted aryl provided that at least one of $R^1$ through $R^5$ is $C_1$-$C_{18}$ linear, branched, or cyclic alkoxy.

17. The composition of claim 16, wherein said one or more cyclic compounds have a formula according to Formula (5),

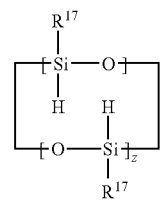

(5)

wherein $R^{17}$ is independently $C_1$-$C_{18}$ linear, branched, or cyclic alkyl, $C_1$-$C_{18}$ linear, branched, or cyclic alkoxy, or substituted or unsubstituted aryl; and z is about 2 to about 21.

18. The composition of claim 17, wherein $R^{17}$ is methyl, ethyl, propyl, butyl, or cyclohexyl; and z is about 2 to about 11.

19. The composition of claim 17, wherein said cyclic organohydrosiloxanes of Formula (5) are selected from the group consisting of: 1,3,5-trimethylcyclotrisiloxane, 1,3,5-triethylcyclotrisiloxane, 1,3,5-triphenylcyclotrisiloxane, 1,3,5-tri(4-methylphenyl)cyclotrisiloxane, 1,3,5,7-tetramethylcyclotetrasiloxane, 1,3,5,7-tetraethylcyclotetrasiloxane, 1,3,5,7-tetraphenylcyclotetrasiloxane, 1,3,5,7-tetra(4-methylphenyl)cyclotetrasiloxane, 1,5-dimethyl-3,7-diethylcyclotetrasiloxane, 1,3-dimethyl-5,7-diethylcyclotetrasiloxane, 1,3,5,7,9-pentamethylcyclopentasiloxane, 1,3,5,7,9- pentaethylcyclopentasiloxane, 1,3,5,7,9-pentaphenylcyclopentasiloxane, 1,3,5,7,9-penta(4-methylphenyl)cyclopentasiloxane, 1,3,5,7,9,11-hexamethylcyclohexasiloxane, 1,3,5,7,9,11-hexaethylcyclohexasiloxane, 1,3,5,7,9,11-hexaphenylcyclohexasiloxane, 1,3,5,7,9,11-hexa(4-methylphenyl)cyclohexasiloxane, 1,5,9-trimethyl-3,7,11-triethylcyclohexasiloxane, 1,3,5-trimethyl-7,9,11-triethylcyclohexasiloxane, and any combinations thereof.

20. The composition of claim 16, wherein said antioxidant compound of Formula (1) is selected from the group consisting of: 3-methoxyphenol, 2-methoxyphenol, 4-ethoxyphenol, 4-propoxyphenol, 4-butoxyphenol, 3,4,5-trimethoxyphenol, 4-benzyloxyphenol, 2,4,6-tris-benzyloxyphenol, and any combinations thereof.

21. The composition of claim 16, wherein said antioxidant compound is present in an amount about 1 ppm to about 1000 ppm.

22. The composition of claim 16, wherein said antioxidant compound is present in an amount about 25 ppm to about 200 ppm.

23. The composition of claim 16, wherein at least one of $R^1$ through $R^5$ is $C_1$-$C_{18}$ linear or branched alkoxy.

* * * * *